United States Patent
Ecker et al.

(10) Patent No.: US 11,515,140 B2
(45) Date of Patent: Nov. 29, 2022

(54) CHAMFERED SILICON CARBIDE SUBSTRATE AND METHOD OF CHAMFERING

(71) Applicant: SiCrystal GmbH, Nuremberg (DE)

(72) Inventors: Bernhard Ecker, Nuremberg (DE); Ralf Müller, Zirndorf (DE); Matthias Stockmeier, Egloffstein (DE); Michael Vogel, Nuremberg (DE); Arnd-Dietrich Weber, Forchheim (DE)

(73) Assignee: SICRYSTAL GMBH, Nuremberg (DE)

( * ) Notice: Subject to any disclaimer, the term of this patent is extended or adjusted under 35 U.S.C. 154(b) by 0 days.

(21) Appl. No.: 16/409,706

(22) Filed: May 10, 2019

(65) Prior Publication Data
US 2019/0348272 A1 Nov. 14, 2019

(30) Foreign Application Priority Data
May 11, 2018 (EP) .................................... 18171737

(51) Int. Cl.
*H01L 21/02* (2006.01)
*H01L 29/16* (2006.01)
(Continued)

(52) U.S. Cl.
CPC ...... *H01L 21/02021* (2013.01); *C30B 23/025* (2013.01); *C30B 29/36* (2013.01);
(Continued)

(58) Field of Classification Search
CPC . C30B 23/025; C30B 29/36; H01L 21/02021; H01L 21/02027; H01L 29/045;
(Continued)

(56) References Cited

U.S. PATENT DOCUMENTS

| 5,045,505 A | 9/1991 | Kimura |
| 5,117,590 A | 6/1992 | Kudo et al. |

(Continued)

FOREIGN PATENT DOCUMENTS

| CA | 881786 A | 9/1971 |
| CN | 101607377 A | 12/2009 |

(Continued)

OTHER PUBLICATIONS

Bond, "Device for preparing accurately X-ray oriented crystals." Journal of Scientific Instruments, 1961;38(2):63-64.
(Continued)

*Primary Examiner* — Maria V Ewald
*Assistant Examiner* — Ethan Weydemeyer
(74) *Attorney, Agent, or Firm* — Michael Best & Friedrich LLP

(57) ABSTRACT

The present invention relates to a chamfered silicon carbide substrate which is essentially monocrystalline, and to a corresponding method of chamfering a silicon carbide substrate. A silicon carbide substrate according to the invention comprises a main surface (102), wherein an orientation of said main surface (102) is such that a normal vector ($\vec{O}$) of the main surface (102) includes a tilt angle with a normal vector ($\vec{N}$) of a basal lattice plane (106) of the substrate, and a chamfered peripheral region (110), wherein a surface of the chamfered peripheral region includes a bevel angle with said main surface, wherein said bevel angle is chosen so that, in more than 75% of the peripheral region, normal vectors ($\vec{F}\_i$) of the chamfered peripheral region (110) differ from the normal vector of the basal lattice plane by less than a difference between the normal vector of the main surface and the normal vector of the basal lattice plane of the substrate.

6 Claims, 11 Drawing Sheets

(51) Int. Cl.
*H01L 29/34* (2006.01)
*H01L 29/04* (2006.01)
*C30B 29/36* (2006.01)
*C30B 23/02* (2006.01)

(52) U.S. Cl.
CPC ...... *H01L 21/02027* (2013.01); *H01L 29/045* (2013.01); *H01L 29/1608* (2013.01); *H01L 29/34* (2013.01); *Y10T 428/219* (2015.01)

(58) Field of Classification Search
CPC .. H01L 29/1608; H01L 29/34; Y10T 428/219
See application file for complete search history.

(56) References Cited

U.S. PATENT DOCUMENTS

| | | | |
|---|---|---|---|
| 5,490,811 | A | 2/1996 | Hosokawa |
| 5,866,477 | A | 2/1999 | Ogawa et al. |
| 5,928,066 | A | 7/1999 | Hasegawa et al. |
| 6,174,222 | B1 | 1/2001 | Sato et al. |
| 6,267,649 | B1 | 7/2001 | Lai et al. |
| 6,302,769 | B1 | 10/2001 | Nishi et al. |
| 6,361,405 | B1 | 3/2002 | David et al. |
| 6,439,969 | B1 | 8/2002 | Koma et al. |
| 7,655,315 | B2 | 2/2010 | Kamiyama et al. |
| 8,865,324 | B2 | 10/2014 | Straubinger et al. |
| 8,975,643 | B2 | 3/2015 | Okita et al. |
| 9,492,910 | B2 | 11/2016 | Ishii et al. |
| 10,000,031 | B2 | 6/2018 | Elliott |
| 2005/0142882 | A1 | 6/2005 | Kida et al. |
| 2005/0161808 | A1 | 7/2005 | Anderson |
| 2007/0105258 | A1 | 5/2007 | Yoshida |
| 2008/0293336 | A1 | 11/2008 | Zhang et al. |
| 2009/0163119 | A1 | 6/2009 | Yamazaki et al. |
| 2011/0300323 | A1* | 12/2011 | Straubinger ............ C30B 23/02 428/64.1 |
| 2012/0156886 | A1 | 6/2012 | Shirako et al. |
| 2012/0325196 | A1 | 12/2012 | Okita et al. |
| 2013/0101790 | A1 | 4/2013 | Okafuji et al. |
| 2013/0264584 | A1 | 10/2013 | Okita et al. |
| 2014/0027787 | A1 | 1/2014 | Gunjishima et al. |
| 2014/0073228 | A1 | 3/2014 | Okita et al. |
| 2014/0340730 | A1 | 11/2014 | Bergh et al. |
| 2016/0086798 | A1 | 3/2016 | Tanaka et al. |
| 2016/0233080 | A1 | 8/2016 | Tanaka et al. |
| 2017/0256391 | A1 | 9/2017 | Okita et al. |
| 2017/0301533 | A1 | 10/2017 | Miyazawa et al. |
| 2018/0019115 | A1 | 1/2018 | Fan et al. |
| 2018/0085851 | A1 | 3/2018 | Hirata |
| 2020/0090923 | A1 | 3/2020 | Yamashita |
| 2020/0203163 | A1 | 6/2020 | Kamei |

FOREIGN PATENT DOCUMENTS

| | | |
|---|---|---|
| CN | 105814245 A | 7/2016 |
| DE | 102013210057 A1 | 12/2014 |
| JP | H10125633 A | 5/1998 |
| JP | 2006120865 A | 5/2006 |
| JP | 2010235390 A | 10/2010 |
| JP | 2011192687 A | 9/2011 |

OTHER PUBLICATIONS

European Patent Office Search Report for Application No. 18171737.2, dated Oct. 9, 2018, 10 pages.
Chinese Patent Office Action and Search Report for Application No. 201910394737 9 dated Jun. 3, 2020 (14 pages, English translation included).
European Patent Office Search Report for Application No. 18171736.4 dated Oct. 12, 2018, 5 pages.
Japanese Patent Office Action for Application No. 2019-089737 dated Sep. 23, 2020 (6 pages, English translation included).
Japanese Patent Office Action for Application No. 2019-089781 dated Sep. 23, 2020 (6 pages, English translation included).
Chinese Patent Office Action and Search Report for Application No. 201910395403.3 dated Nov. 4, 2020 (17 pages, English translation included).

* cited by examiner

CHAMFERED SILICON CARBIDE SUBSTRATE AND METHOD OF CHAMFERING

This application claims priority to European Patent Application No. 18171737.2, filed May 11, 2018, the content of which is incorporated herein by reference in its entirety.

The present invention relates to a chamfered silicon carbide substrate which is essentially monocrystalline, and to a corresponding method of chamfering a silicon carbide substrate.

Due to its outstanding physical, chemical and electrical properties silicon carbide is used inter alia as a semiconductor substrate material for power electronics semiconductor components, for radio frequency components and for a variety of special light emitting semiconductor components. Bulk SiC crystals with ideally pure and defect-free quality are required as a basis for these products.

As this is known in the art, bulk SiC crystals are generally produced by means of physical vapor deposition techniques, in particular using a sublimation method as for instance shown in U.S. Pat. No. 8,865,324 B2. Temperatures of more than 2000° C. are required for this process. Physical vapor transport (PVT) is essentially a sublimation and re-condensation process, in which a source material and a seed crystal are placed inside a growth furnace in such a way that the temperature of the source material is higher than that of the seed, so that the source material sublimes and the vapor species diffuse and deposit onto the seed to form single crystals.

For producing wafer-shaped substrates, the bulk SiC crystals are sliced e.g., by means of diamond wire saws. The surface is refined by subsequent multistage polishing steps. In order to mechanically stabilize the substrate during these processing steps, the edge of the substrate is usually mechanically treated. For fabricating electronic components, thin monocrystalline layers (e.g., SiC or GaN) are epitaxially deposited on the polished substrates. The characteristics of these layers and consequently the quality of the electronic components fabricated therefrom decisively depend on the quality of the underlying SiC substrate, and particularly on the characteristics of the main surface. The characteristics of the main surface include for instance roughness, damage, orientation, and dislocation density. It is known to use so-called off oriented substrates in order to achieve a crystal growth involving step-flow, thereby avoiding facetted crystal growth. With step-flow growth the quality of the epitaxial layers can be improved because the offcut produces a series of steps and terraces on the SiC surface that promotes lateral growth (step-flow growth). In this manner, the epilayer replicates the stacking order of the substrate, and high quality epitaxial growth ensues.

In the context of the present invention, the term "off orientation" signifies the situation where the main surface of the substrate on which the epitaxial layers are to be grown includes an angle with a defined lattice plane. In other words, the normal axis of the main surface is not oriented to coincide with the normal axis of this lattice plane, but is oriented to be "off axis". On the other hand, substrates where the normal axis of the main surface coincides with the normal axis of the basal lattice plane, are called "on axis".

While the ensuing description of the invention is directed primarily to 4-SiC substrate materials, it will be appreciated that the utility of the invention is not thus limited, and that the invention broadly contemplates other types of silicon carbide substrates, such as exist in a great variety of hexagonal (H) crystal forms, among the more than 200 polytypes of silicon carbide. 4H—SiC and 6H—SiC are presently preferred, with 4H—SiC being most preferred.

In this respect, it is to be noted that the offcut epitaxial growth surface is described herein for various hexagonal crystallographic forms of SiC, in corresponding hexagonal directional notation.

The present invention contemplates the formation of corresponding substrates. In the case of 4H—SiC, the substrate has a planar growth surface (interface) that is offcut, i.e., inclined with respect to the axis of a basal plane thereof, with an angle of inclination between the planar growth surface and the axis of the basal plane (offcut angle) from about 0.5 to about 8°, more preferably 4°. The (0001) SiC substrates may be offcut towards the <1100> or the <1120> crystalline direction.

The inventors of the present invention have recognized that due to the off-orientation of the main surface of the substrate, the mechanically treated edges may have regions with on-axis oriented surfaces under particular geometrical conditions. During the deposition of the epitaxial layers on the on axis oriented surface regions crystalline defects can be generated due to faceted growth. Any subsequence epitaxial processes may suffer from an expansion of these defects due to the step grows even into the substrate main surface, causing increased reject due to defects.

Conventional wafer fabrication processes often put up with these defects caused by faceted growth at the wafer during epitaxial growth, thereby having to deal with a reduced rate of yield for the complete production chain. Examples for conventional wafer production processes that apply chamfered edges to the periphery of the wafer are disclosed in U.S. Pat. No. 5,866,477 A and US 2008/293336 A1. Furthermore, it is known to fabricate silicon substrates with a curved chamfered edge, as for instance disclosed in U.S. Pat. No. 6,302,769 B1 and JP 2006-120865 A.

US 2012/325196 A1 discloses a method for manufacturing a silicon carbide substrate includes the steps of preparing an ingot of single crystal silicon carbide, obtaining a silicon carbide substrate by cutting the ingot, and forming a chamfer portion in a region including an outer peripheral surface of the silicon carbide substrate. In the step of obtaining the silicon carbide substrate, the ingot is cut such that a main surface of the silicon carbide substrate forms an angle of not less than 10° with respect to a {0001} plane.

US 2014/027787 A1 discloses an SiC single crystal having at least one orientation region where a basal plane dislocation has a high linearity and is oriented to three crystallographically-equivalent <11-20> directions, and an SiC wafer and a semiconductor device which are manufactured from the SiC single crystal. The SiC single crystal can be manufactured by using a seed crystal in which the offset angle on a {0001} plane uppermost part side is small and the offset angle on an offset direction downstream side is large and growing another crystal on the seed crystal.

W. L. Bond: "Device for preparing accurately X-ray oriented crystals", Journal of Scientific Instruments, vol. 38, issue 2, pp. 63-64, 02/1961, describes a combined orienting-grinding device for producing surfaces accurately oriented with regard to the crystal orientation. The device uses an x-ray orienting goniometer for determining the crystal orientation and adjusting the position of the crystal.

Consequently, there is still a need for an improved silicon carbide substrate and a method of chamfering an essentially monocrystalline silicon carbide substrate, so that a surface of a chamfered peripheral region includes a bevel angle with a main surface of the substrate, that ensure improved characteristics of the epitaxial layers grown on the substrate and in particular do not suffer from parasitic or disturbed growth of the epitaxial layer starting from local on-axis regions present in the peripheral area of the substrate.

This object is solved by the subject matter of the independent claims. Advantageous embodiments of the present invention are the subject matter of the dependent claims.

The present invention is based on the idea that with off-axis SiC substrates, the occurrence of parasitic on-axis zones generated by chamfering the wafer can be avoided by choosing the bevel angle of the chamfer depending on the actual tilt angle of the main surface.

In particular, the present invention provides a silicon carbide substrate which is essentially monocrystalline, the silicon carbide substrate comprising a main surface, wherein an orientation of said main surface is such that a normal vector of the main surface includes a tilt angle with a normal vector of a basal lattice plane of the substrate and a chamfered peripheral region, wherein a surface of the chamfered peripheral region includes a bevel angle with said main surface. According to the present invention, the said bevel angle is chosen so that, in more than 75% of the peripheral region, normal vectors of the chamfered peripheral region differ from the normal vector of the basal lattice plane by less than a difference between the normal vector of the main surface and the normal vector of the basal lattice plane of the substrate.

This arrangement has the advantage that on the chamfer surface no local on-axis oriented regions occur which tend to cause parasitic growth of epitaxial layers. Consequently, it can be avoided that such parasitic and defective growth of epitaxial layers adversely affects the main substrate surface.

According to an advantageous embodiment of the present invention, the difference between the normal vector of the main surface and the normal vector of the basal lattice plane of the substrate is measured at a location adjacent to the chamfered peripheral region. This is important for taking into account that the off-cut SiC substrate usually is not fully uniform over its complete diameter. Generally, the actual tilt angle should be measured as close to the chamfered peripheral region as possible and may of course also be measured in a region which is later removed when beveling the substrate.

According to an advantageous embodiment of the present invention, the chamfered peripheral region is arranged around at least 95% of the circumference of the substrate. This relatively high proportion has the advantage that the mechanically stabilizing effect of the chamfer is taken advantage of to a sufficiently high extent.

Furthermore, the substrate according to an example the present invention has a surface roughness of equal to or less than 10 nm on at least 80% of the chamfered peripheral region. Such a relatively smooth surface of the chamfered region further enhances the quality of the epitaxial layers grown on the substrate.

As already mentioned above, the principles of the present invention can be applied to all types of silicon carbide substrates, in particular to substrates that have a polytype selected from a group comprising 4H and 6H.

Advantageously, the substrate is offcut so that the tilt angle is in a range between 0.5° and 8°. Preferable, the tilt angle is 4°. However, it is clear for a person skilled in the art that the present invention is not limited to these particular values. Smaller or larger angles may also be used, as long as the step-flow growth of epitaxial layers is ensured.

Advantageously, the silicon carbide substrate has a thickness of at least 200 μm and not more than 1000 μm. More specifically, the silicon carbide substrate may have a diameter of at least 150±0.2 mm and/or a thickness of 350±25 μm. It is, however, clear for a person skilled in the art that any other suitable dimensions may also be used with the principles according to the present invention.

The present invention furthermore provides a method for fabricating substrates according to the present invention. In particular, the present invention relates to a method of chamfering an essentially monocrystalline silicon carbide substrate, so that a surface of a chamfered peripheral region includes a bevel angle with a main surface of the substrate, the method comprising the following steps:

measuring an orientation of a basal lattice plane of the substrate with respect to the main surface of the substrate, determining said bevel angle so that, in more than 75% of the peripheral region, normal vectors of the chamfered peripheral region differ from a normal vector of the basal lattice plane by less than a measured difference between a normal vector of the main surface and the normal vector of the basal lattice plane of the substrate, working the substrate to form the chamfered peripheral region having the determined bevel angle.

The measurement of the tilt angle may for instance be performed using X-ray diffraction (XRD), as this is generally known. Single-crystal X-ray diffraction is a non-destructive analytical technique which provides detailed information about the internal lattice of crystalline substances, including unit cell dimensions, bond-lengths, bond-angles, and details of site-ordering. Moreover, by using a goniometer and performing a Theta-scan around the substrate, the offcut angle can be determined around the complete perimeter of the wafer.

According to an advantageous embodiment of the present invention, the orientation of the main surface of the substrate with respect to the basal lattice plane of the substrate is measured in at least one location adjacent to the peripheral region that is to be chamfered. Alternatively, the measurement may also be performed within the region that is later removed during the step of forming the chamfered peripheral region. In order to safely prevent the occurrence of undesired local surfaces with on-axis orientation, it is advantageous that the measurement is performed as close as possible to the later chamfered region because the actual tilt angle may slightly vary over the complete diameter of the main surface.

Advantageously, the step of working the substrate includes a grinding step and/or a laser cutting step. Any suitable manner of machining the edge of the substrate for forming the chamfer may be used according to the present invention. However, a grinding device can be adjusted in its machining angle in a particularly simple and accurate way. In particular, a rotating grindstone can be used for chamfering the peripheral edge of the substrate with the desired bevel angle.

Advantageously, the step of measuring the orientation of the tilt angle comprises:

measuring an absolute value of the tilt angle in at least one location using an X-ray diffraction (XRD) measuring device, for instance, with an energy dispersive detector, determining a minimal value of the measured tilt angle, and wherein the bevel angle is set to a value that is 0.5° less than the minimal value.

Of course, as this is clear for a person skilled in the art, any other suitable value may also be set for the bevel angle of the chamfered region, as long as it can be avoided that undesired on-axis surface regions are created.

According to an advantageous embodiment of the present invention, the substrate is worked using a grinding head which is mechanically connected to an X-ray diffraction (XRD) measuring device. This arrangement has the advantage that the measurement and grinding steps can be performed by one combined machining device and that the substrate does not have to be relocated into another device. Thereby, the accuracy is enhanced and the processing time and costs are reduced.

Moreover, the measurement is advantageously performed at a plurality of measuring locations around the circumference of the substrate, for instance at 8 points, which are for instance evenly distributed around the perimeter. When performing a plurality of measurements, the bevel angle can be varied locally as indicated by the respectively measured tilt angle. On the other hand, also only one constant bevel angle can be calculated from evaluating all measurement results and generating one tilt angle value from the minimal value of the plurality of measurement results, or from a mean value of the plurality of measurement results. In other words, the tilt angle may be measured at a plurality of locations around the circumference of the substrate and the bevel angle is then varied around the circumference of the substrate, depending on the measured tilt angle.

Due to its hexagonal lattice structure, the silicon carbide substrate exhibits as the outermost surface a silicon side and a carbon side. The silicon side is usually the side on which the epitaxial layers are grown. According to an advantageous embodiment of the present invention, the chamfered peripheral region with the determined bevel angle is arranged only on the silicon side of the substrate. The carbon side of the substrate, on the other hand, may have any arbitrary bevel angle. Thereby, the processing can be simplified because the measurement has to be performed only on one side.

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements, and wherein:

The present invention will now be explained in more detail with reference to the Figures and firstly referring to FIG. 1.

Figure 1:
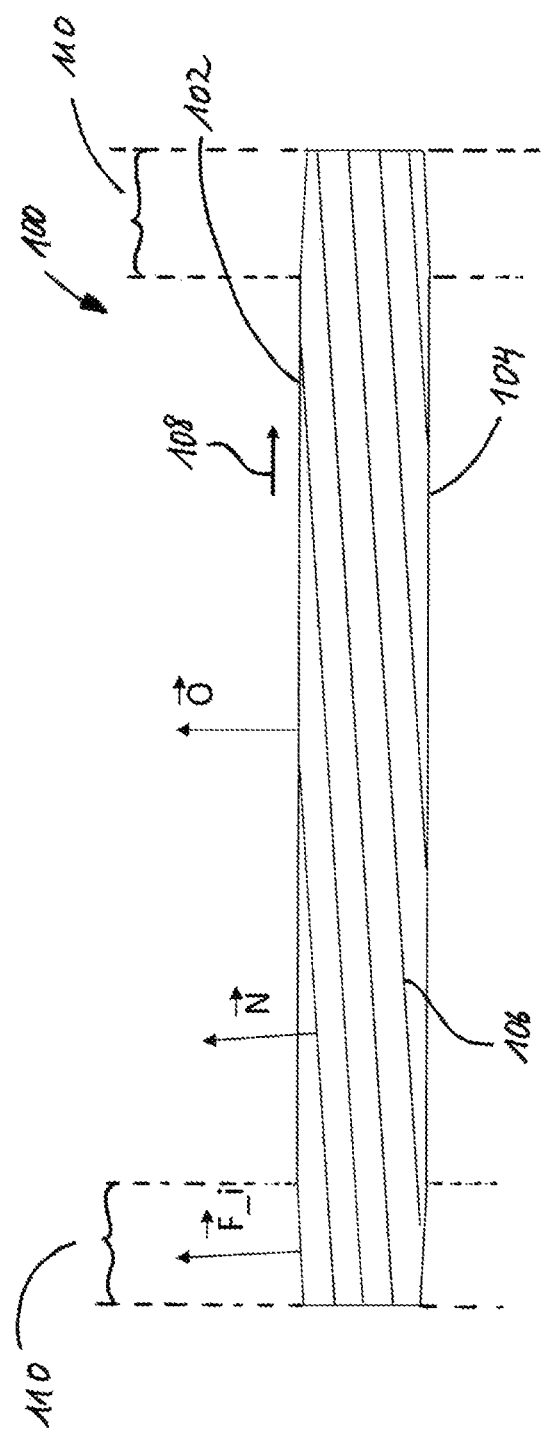
FIG. 1 is a schematic representation of an SiC substrate according to a first embodiment of the present invention.

FIG. 1 shows a SiC substrate 100 according to a first advantageous embodiment of the present invention. It has to be noted, that the dimensions are not to scale in order to illustrate the idea according to the present invention. In particular, the thickness of the substrate is shown enlarged in comparison to the diameter. The SiC substrate has a first surface 102 and a second surface 104. In the following, the first surface 102 will be referred to as the main surface, where as the second surface 104 is also referred to as the bottom surface. Normally, the first surface 102 is the silicon surface of the SiC substrate 100, and the second surface 104 is the carbon surface of the substrate 100. The main surface 102 is the surface on which later epitaxial layers are deposited. The orientation of the main surface 102 is indicated by the normal vector $\vec{O}$.

In FIG. 1, the set of lattice basal planes 106 are shown to have a normal vector N. As schematically indicated by the lattice planes 106, the SiC substrate 100 is offcut at an angle of 4°. In other words, the normal vectors $\vec{O}$ and $\vec{N}$ include a tilt angle of 4°. Due to the tilt angle, epitaxial growth is taking place as a step-flow growth. The step-flow growth direction is indicated in FIG. 1 by the arrow 108.

In order to mechanically stabilize the substrate, the peripheral regions of the essentially circular wafer have to be provided with a chamfered region 110. The orientation of the surface plane of the chamfered region at any given location i is described by a normal vector $\vec{F}\_i$. The inventors of the present invention have recognized that in case that the normal vector $\vec{F}\_i$ coincides with the normal vector $\vec{N}$ of the lattice planes, this would be a local on-axis orientation of the surface of the silicon carbide substrate 100. Such an on-axis orientation is disadvantageous because on on-axis oriented surfaces, a faceted growth takes place. Any faceted growth of an epitaxial layer is undesired because it causes enhanced forming of defects which may even reach into the area of the substrate main surface 102 where electronic components will be located. The quality of the epitaxial layer may be impaired and waste might be enhanced.

Furthermore, in case that the normal vector $\vec{F}\_i$ includes with the normal vector $\vec{N}$ of the lattice planes a bevel angle which is larger than the tilt angle, step-flow growth would be induced that is directed against the direction 108. When the direction of the step-flow growth is reversed, an additional growth front is generated, which may collide with the main step-flow growth front growing along the direction 108 and thus cause defects in the layer formation.

Consequently, according to the present invention, it is ensured that a uniform step-flow growth of the epitaxial layers is induced not only for the substrate main surface 102 but also in the peripheral chamfered regions 110. In particular, the bevel angle which is included by the normal vector $\vec{F}\_i$ and normal vector $\vec{O}$ of the main substrate surface 102 has to be smaller than the tilt angle which is included by the normal vector $\vec{O}$ and the normal vector $\vec{N}$ of the basal lattice planes.

The condition that has to be fulfilled is given by the following relation (1):

$$\sphericalangle(\vec{F}\_i,\vec{O}) < \sphericalangle(\vec{N},\vec{O}) \qquad (1)$$

It could be shown that this condition has to be met for at least 75% of the total circumference of the silicon carbide substrate in order to effectively reduce undesired defects. Preferably, the chamfering according to the present invention is applied around at least 95% of the circumference.

In other words, the present invention provides an essentially monocrystalline silicon carbide substrate with a chamfered periphery, wherein the absolute value of the vector difference between the surface of the chamfered area and the main surface orientation has to be smaller than the vector difference between the orientation of the main surface and lattice plane orientation. Advantageously, this particular dimensioning of the chamfered region is only applied to the silicon side 102, while the carbon side 104 may be provided with an arbitrary chamfering. For instance, the silicon substrate 100 has a diameter of at least 150 mm and a thickness of not more than 1000 µm, at least 200 µm, preferably 350±25 µm. Advantageously, the substrate has a rough number of 10 nm or less on at least 80% of the chamfered surface 110. The polytype of the substrate may for instance be 4H or 6H, and preferably is 4H. The tilt angle (offcut angle) between the main surface and the lattice plane orientation preferably is 4° as shown in FIG. 1, but may take any value between 0.5° and 8°.

Figure 2:
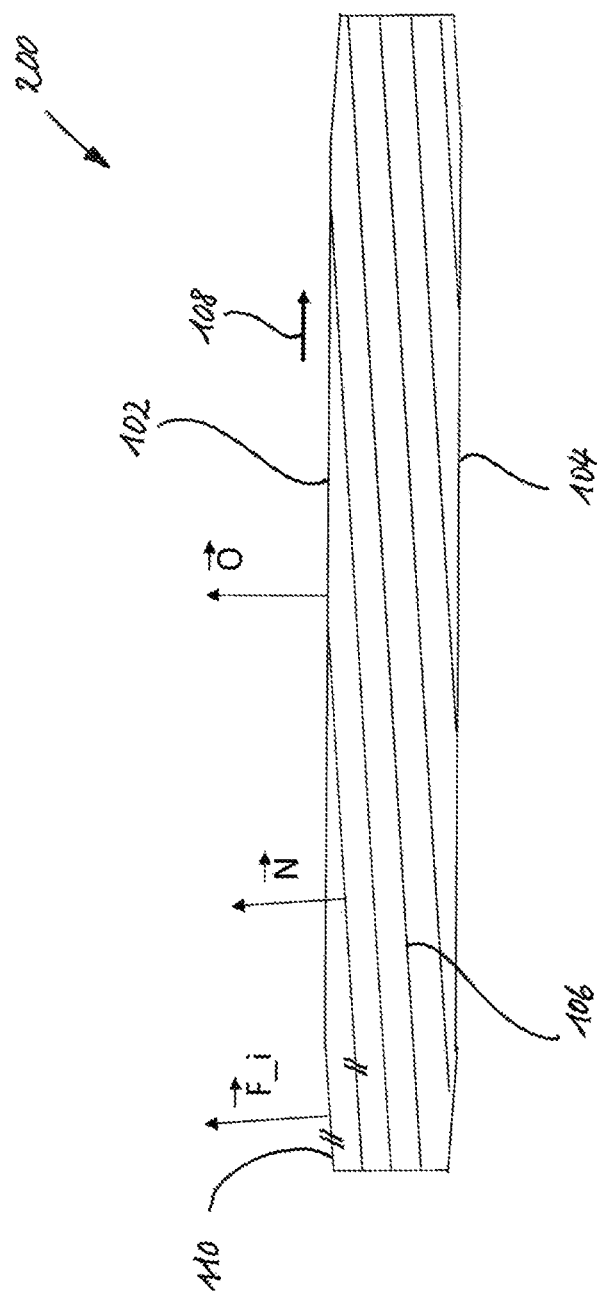
FIG. 2 is a schematic representation of an SiC substrate with an on-axis orientation of the chamfer.
Figure 3:
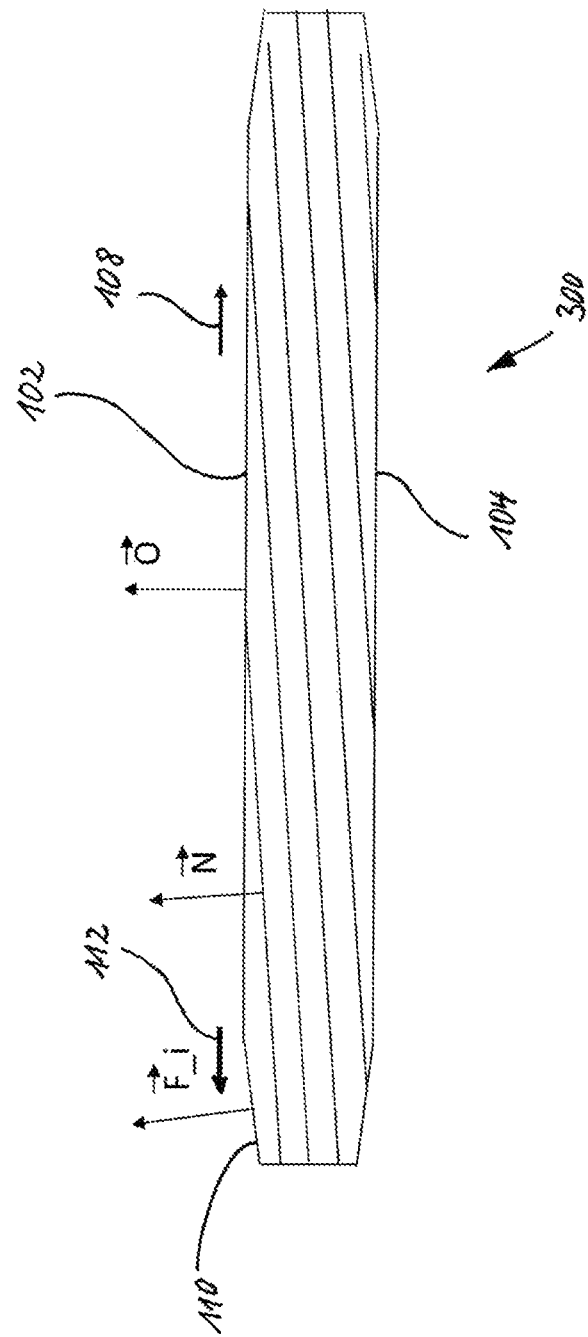
FIG. 3 is a schematic representation of an SiC substrate with a too large bevel angle.

By way of comparison, FIGS. 2 and 3 show the undesired scenarios mentioned above for a silicon carbide substrate having a cutoff (or tilt) angle of 4°. In particular, FIG. 2 shows a silicon carbide substrate, where the normal vector $\vec{F}\_i$ coincides with the normal vector $\vec{N}$ of the lattice claims, as given by equation (2):

$$\sphericalangle(\vec{F}\_i,\vec{O}) = \sphericalangle(\vec{N},\vec{O}) \qquad (2)$$

Faceted growth will be induced when depositing the epitaxial layers.

On the other hand, FIG. 3 illustrates the undesired case where the bevel angle which is included by the normal vector $\vec{F}\_i$ and normal vector $\vec{O}$ of the main substrate surface 102 is larger than the tilt angle, as given in relation (3) below:

$$\sphericalangle(\vec{F}\_i,\vec{O}) > \sphericalangle(\vec{N},\vec{O}) \qquad (3)$$

In this case, step-flow growth of the epitaxial layer may occur along the reverse direction 112, causing colliding growth fronts.

Figure 4:
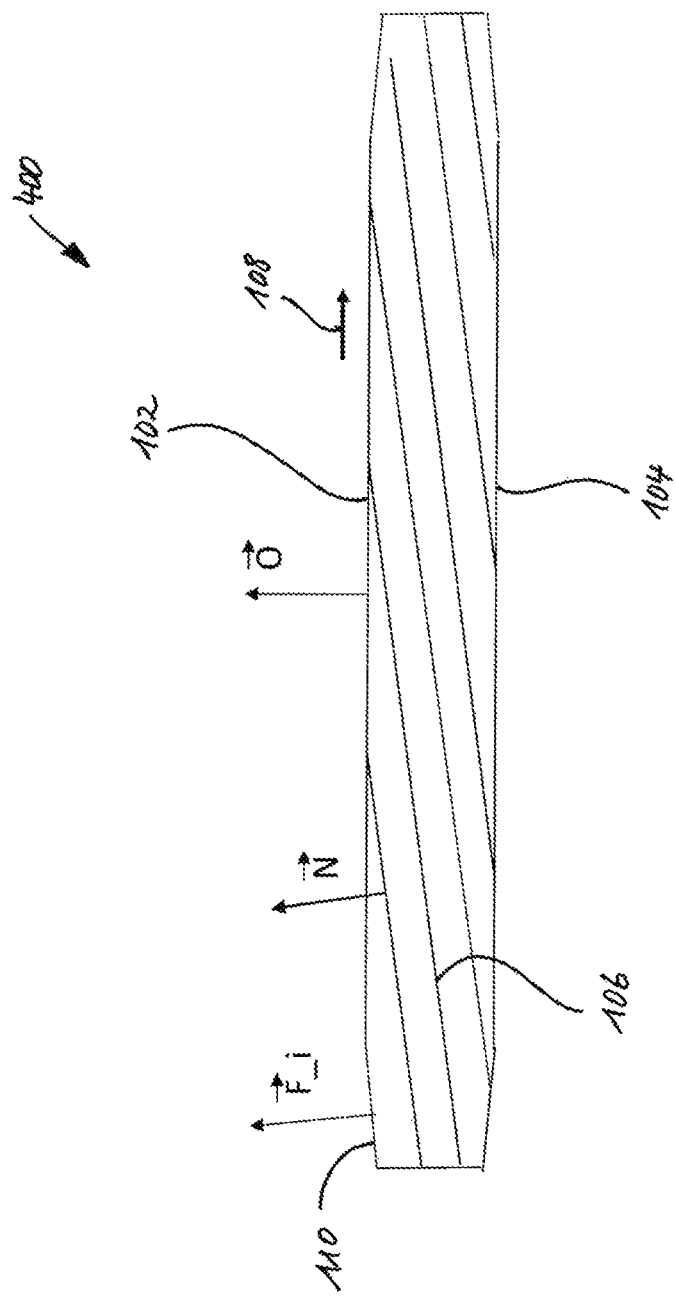
FIG. 4 is a schematic representation of an SiC substrate according to a further embodiment of the present invention.
Figure 5:
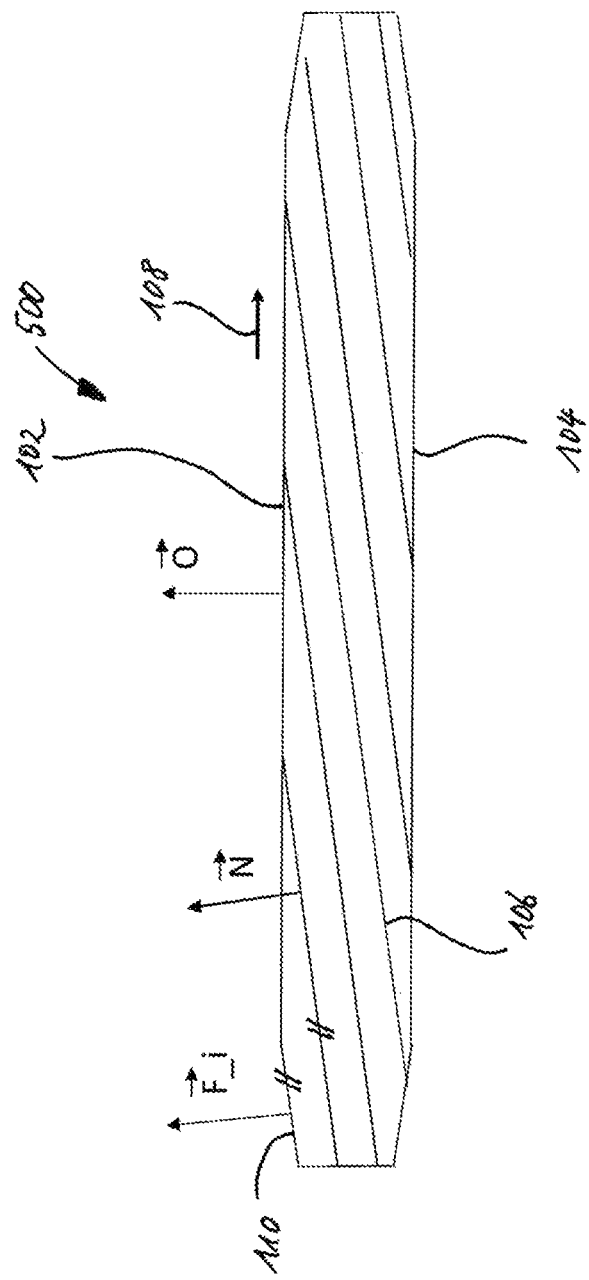
FIG. 5 is a schematic representation of another SiC substrate with an on-axis orientation of the chamfer.
Figure 6:
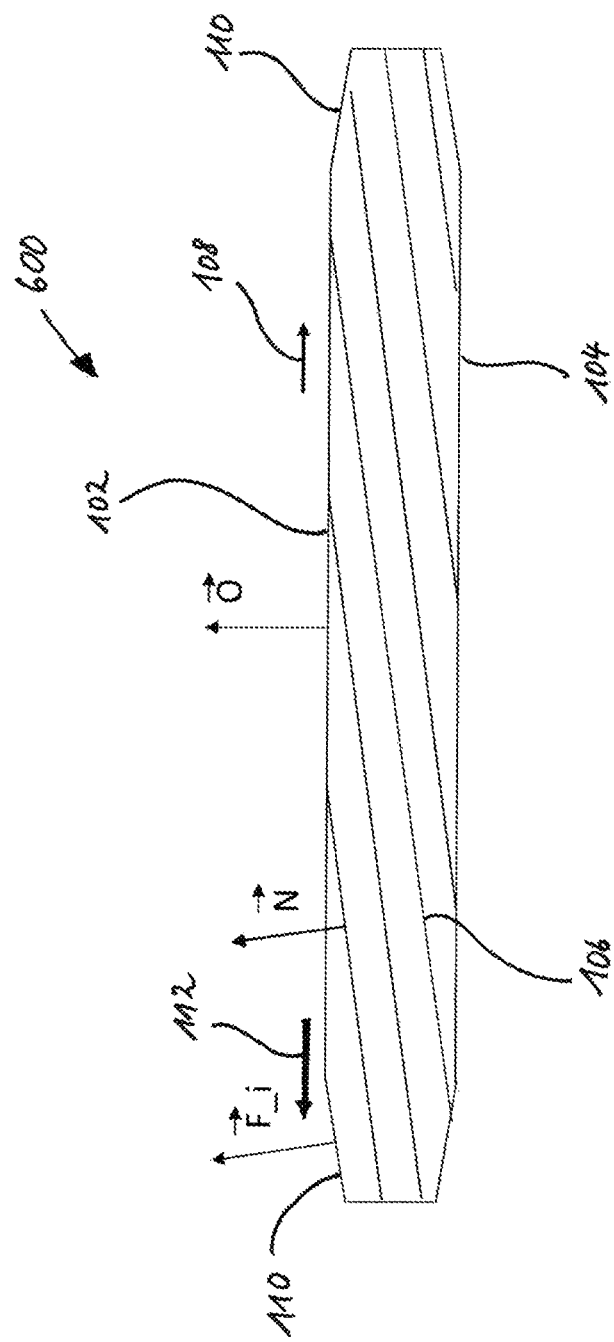
FIG. 6 is a schematic representation of another SiC substrate with a too large bevel angle.

FIGS. 4-6 illustrate the scenarios shown in FIGS. 1-3 for the case that the cutoff angle is 8°. In particular, for silicon carbide substrate 400 according to the present invention, relation (1) is fulfilled. For silicon carbide substrate 500, on the other hand, equation (2) is fulfilled. Faceted growth will be induced when depositing the epitaxial layers. For silicon carbide substrate 600, relation (3) is fulfilled. In this case, step-flow growth of the epitaxial layer may occur along the reverse direction 112, causing colliding growth fronts.

Figure 7:
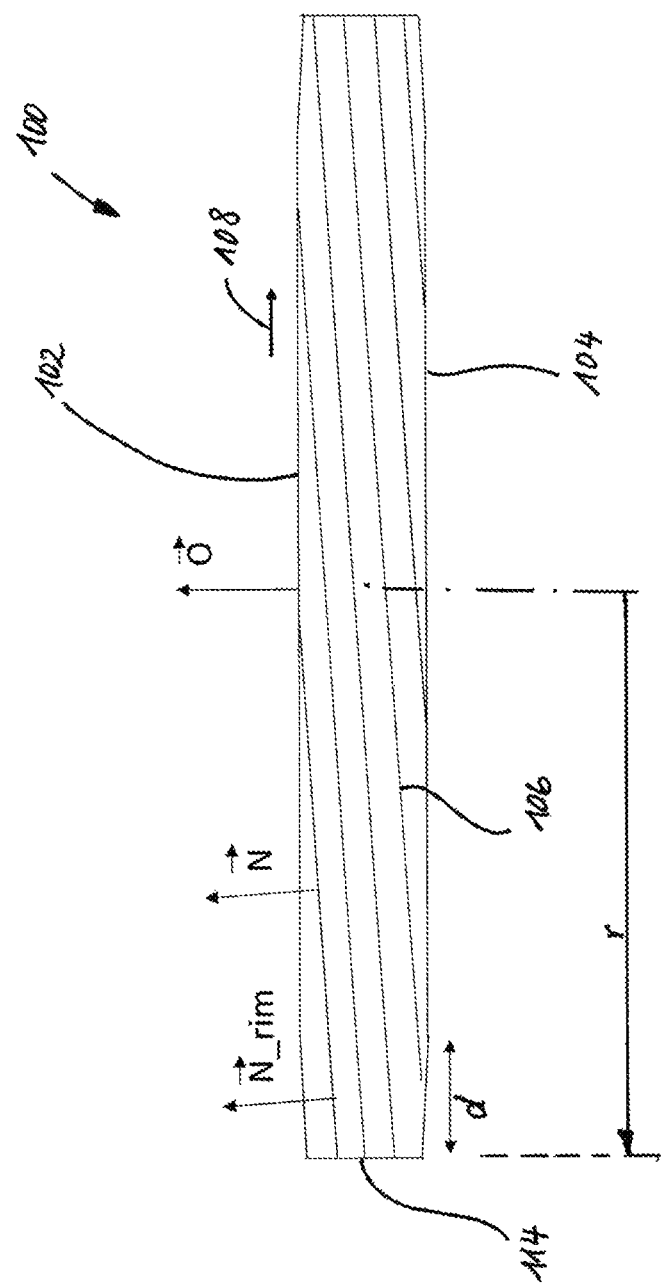
FIG. 7 is a schematic representation of an SiC substrate according to a further embodiment.

In order to ensure that the chamfered region is machined onto the silicon carbide substrate, first the actual tilt angle $\sphericalangle(\vec{N}, \vec{O})$ has to be measured. In particular, it has to be considered at which location(s) such a measurement is performed. In the following, the various possible locations of where to measure the tilt angle will be discussed. Referring to FIG. 7 and additionally turning back to FIG. 1, a substrate 100 is shown, where the nominal tilt angle $\sphericalangle(\vec{N}, \vec{O})$ at the main surface 102 is 4°. In this case, the lattice planes 106 have the same orientation in the peripheral region that will become the chamfered region 110 after machining. The peripheral region has a dimension d from an end face 114 of the substrate 100, the distance d representing the future bevel's breadth. In the case that the normal vector $\vec{N}\_{rim}$ within the distance d coincides with the normal vector $\vec{N}$ at the rest of the substrate, it is of no particular importance where the measurement is performed. The tilt angle may for instance be measured within the distance d or within twice the distance d from the end face 114. Alternatively, the location of the measurement may be expressed as a suitable fraction, for instance 90%, of the SiC substrate's radius r, which is counted from the center of the wafer.

Figure 8:
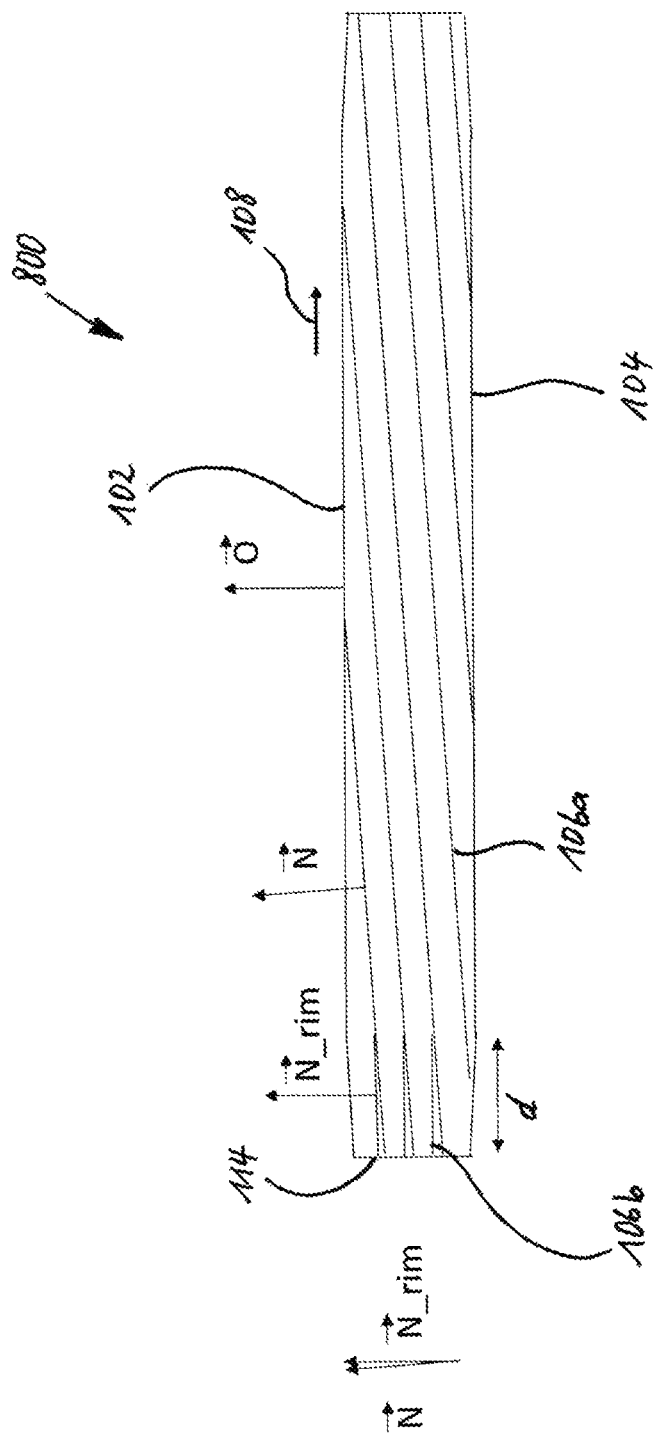
FIG. 8 is a schematic representation of an SiC substrate according to a further embodiment.

A different situation is depicted in FIG. 8. According to this Figure, the lattice planes 106b are tilted against the lattice planes 106a in the bulk of the substrate 800. In other words, the marginal normal vector $\vec{N}\_{rim}$ within the distance d from the end face 114 includes an angle with the normal vector $\vec{N}$ of the bulk material. This deviation of the lattice plane orientation in the marginal region compared to the center is caused by the PVT growth conditions when fabricating the single crystal boule (see for instance U.S. Pat. No. 9,590,046 B2). In order to take into account such local deviations, it is advantageous to measure the lattice plane orientation as close as possible to the later chamfered regions 110, preferably within the distance d from the end face 114.

Figure 9:
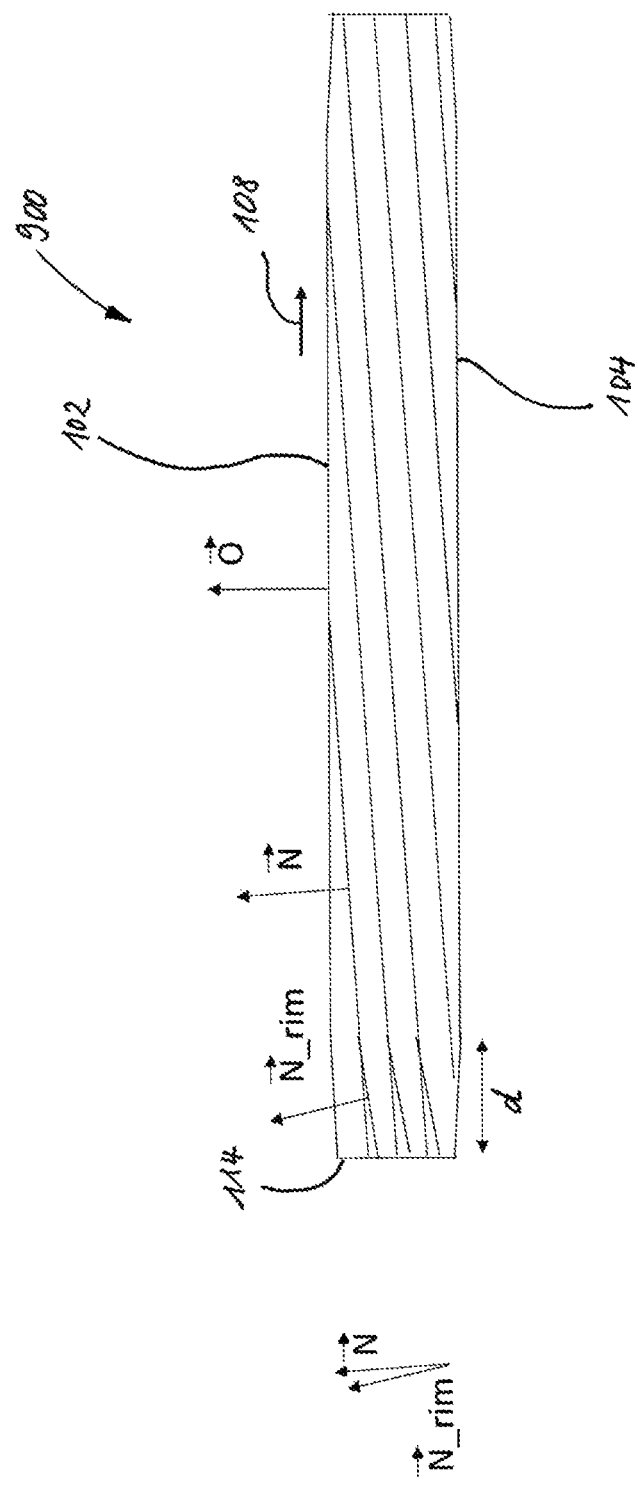
FIG. 9 is a schematic representation of an SiC substrate according to a further embodiment.

The analogous considerations are of course also valid for the case where the orientation of the lattice planes 106b is tilted in the other direction, as this is illustrated in FIG. 9 for a substrate 900.

Figure 10:
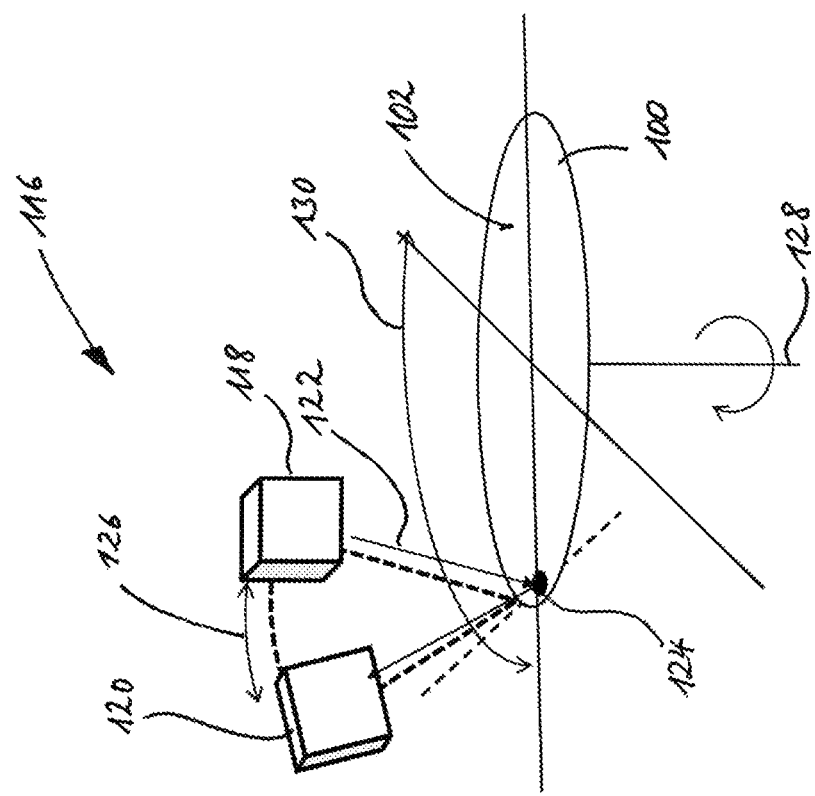
FIG. 10 is a schematic representation of a measurement step.

With reference to FIG. 10, a first embodiment of measuring the lattice plane orientation as a basis for choosing the bevel angle of the chamfered periphery will be explained.

Advantageously, the letters plane orientation of the substrate 100 is measured by means of an X-ray Diffraction (XRD) unit 116 with an energy dispersive detector.

Generally, the arranged atoms of a crystal form a series of parallel lattice planes separated from one another by a distance a, which varies according to the nature of the material. For any crystal, planes exist in a number of different orientations each with its own specific distance a. X-ray Diffraction (XRD) allows the identification of the orientation of these lattice planes with reference to a reference plane. The X-ray diffractometer 116 comprises an X-ray generator 118, a goniometer (angle-measuring device), a sample holder for the substrate 100, and an X-ray detector 120. The X-ray beam 122 hits the sample substrate 100 and the detector 120 records the X-ray intensity diffracted at the substrate. The distances a between the adjacent lattice planes are correlated with the radiation's wavelength $\lambda$ and the angle of reflection by applying Bragg's Law (equation (4)):

$$n\lambda = 2a \cdot \sin\Theta \qquad (4)$$

where n is the order of diffraction (0, 1, 2, 3, . . . ), $\lambda$ is the wavelength of the incident X-ray beam, d is the distance between adjacent lattice planes, and $\Theta$ is the angle of incidence of the X-ray beam. The diffraction angle $2\Theta$ is equal to twice the incident angle $\Theta$. The goniometer is motorized and the detector 120 moves so that the angle 126 of the Ω axis varies through a range of the angle 20. Each time the Bragg condition is satisfied, the detector 120 measures the intensity of the reflected radiation. As the lattice plane distance a is known, the actually measured value of the angle Θ allows calculating the angle under which the lattice planes are lying with respect to the upper surface 102 of the substrate 100. Advantageously, the detector 120 is energy dispersive, thus yielding very fast and accurate measurement results with a comparatively simple set-up.

The measurement is performed at one or more measurement points 124 distributed around the Φ axis 128 by rotating the substrate 100 around the Φ axis 128. The exact location of the measurement point 124 is given as a particular ΔΦ value 130. for instance, the measurement is performed at a plurality of locations 124, and the minimum value of the measured local off-orientation angles is determined.

Figure 11:
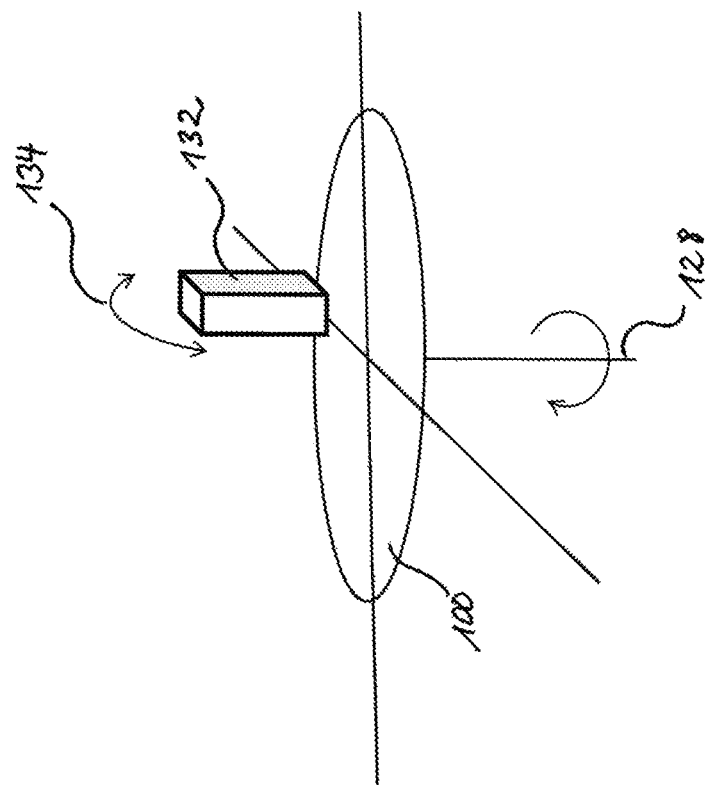
FIG. 11 is a schematic representation of a grinding step.

According to the present invention, these results are used in a second step which is depicted in FIG. 11. As shown in FIG. 11, the substrate undergoes a machining step in order to fabricate the chamfer. This is done for instance by means of a grinding head 132 which can be at adjusted regarding its chamfering angle 134. According to the present invention, the chamfering angle 134 of the grinding head 132 is chosen to be 0.5° smaller than the minimum measured value determined during the measuring step depicted in FIG. 10.

However, if the ΔΦ values 130 are recorded for each measurement point 124 and transmitted to the grinding head's control unit, the grinding head 132 may be positioned in its angle 134 depending on the actual measurement value of each location 124.

Figure 12:
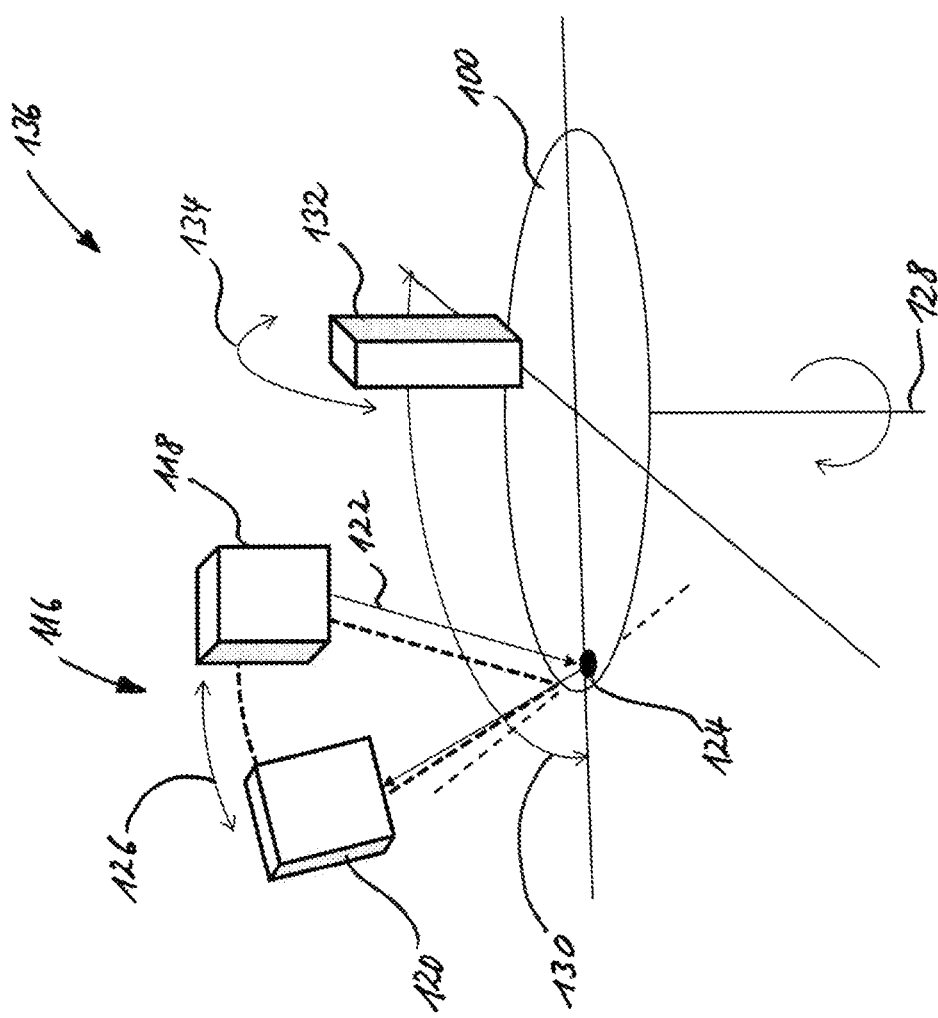
FIG. 12 is a schematic representation of a combined measuring and machining unit.

The present invention also relates to an integrated and continuous process for chamfering silicon carbide substrates 100. This process will be explained in more detail with reference to FIG. 12. Essentially, in FIG. 12 the units shown in FIGS. 10 and 11 are combined into one chamfering unit 136. The chamfering unit 136 comprises an XRT unit 116 and the grinding head 132. Moreover, a control unit (not shown in the Figures) performs control of the chamfering unit 136.

According to a first embodiment of the method according to the present invention, the XRD unit 116 determines by means of the an energy dispersive detector 120 the lattice plane off-orientation at a plurality of measurement points 124 which are located close to the margin of the substrate 100. The grinding head 132 is connected to the goniometer arm of the Ω axis of the XRD unit 116 with an adjustable angle. Again, the substrate 100 rotates around the Φ axis 128. In the shown embodiment, the grinding head 132 is distanced apart from the measurement point 124 by a defined angular ΔΦ distance 130.

The measurement is performed in the direction of the angle 126 of the Ω axis, the extreme value is determined and thereby the grinding angle 134 is determined.

According to a second embodiment of the single step process, the measurement is performed at Y measurement points 128, wherein Y is calculated as the ratio of the substrate circumference and the width of the grinding head's grinding disc. The grinding angle is adapted continuously according to the result of the measurement. Advantageously, the grinding angle can be adjusted automatically by a control unit allocated to the chamfering unit 136. Moreover, the one step method has the advantage that the substrate does not have to be relocated, thereby reducing the processing time and enhancing the accuracy of the chamfering process.

Exemplarily, the following advantageous chamfer angles may be chosen, depending on the particular substrate characteristics.

For a substrate with a nominal tilt angle of 8°±0.5° and a measured minimal value of the tilt angle in a marginal region of 7.8°, a bevel angle of 6.8° may be chosen when determining the bevel angle to be 1° smaller than the measured tilt angle.

Further, for another substrate with a nominal tilt angle of 4°±0.5° and a measured minimal value of the tilt angle in a marginal region of 3.5°, a bevel angle of 2.2° may be chosen when determining the bevel angle to be 1.3° smaller than the measured tilt angle.

Further, for the same substrate with a nominal tilt angle of 4°±0.5°, with a measured minimal value of the tilt angle in a marginal region of 4.5°, a bevel angle of 3.2° may be chosen when determining the bevel angle to be 1.3° smaller than the measured tilt angle.

For a substrate with a nominal tilt angle of 2°±0.5°, with a measured minimal value of the tilt angle in a marginal region of 1.9°, a bevel angle of 1.4° may be chosen when determining the bevel angle to be 0.5° smaller than the measured tilt angle.

| Reference Numerals | |
|---|---|
| Reference Numeral | Description |
| 100, 400 | SiC substrate according to the invention |
| 200, 300, 500, 600 | SiC substrate with undesired bevel angle |
| 102 | Main surface; Si side |
| 104 | Bottom surface; C side |
| 106, 106a, 106b | Lattice planes |
| 108 | Direction of step-flow growth |
| 110 | Chamfered region |
| 112 | Direction of reverse step-flow growth |
| 114 | End face |
| 116 | XRD unit |
| 118 | X-ray generator |
| 120 | X-ray detector |
| 122 | X-ray beam |
| 124 | Measurement point |
| 126 | Angle of Ω axis |
| 128 | Φ axis |
| 130 | ΔΦ value |
| 132 | Grinding head |
| 134 | Chamfering angle |
| 136 | Chamfering unit |
| $\vec{O}$ | Normal vector of main surface |
| $\vec{N}$ | Normal vector of lattice planes |
| $\vec{F}\_i$ | Normal vector of chamfered surface |
| $\vec{N}\_rim$ | Normal vector of lattice planes in the peripheral region |
| d | Width of chamfered region |
| r | Radius of substrate |

We claim:

1. Silicon carbide substrate for epitaxially deposited layers which is essentially monocrystalline, the silicon carbide substrate being fabricated by slicing a bulk SiC crystal, wherein the silicon carbide substrate has a thickness of at least 200 μm and not more than 1000 μm, the silicon carbide substrate comprising:

a main surface (102), wherein an orientation of said main surface (102) is such that a normal vector ($\vec{O}$) of the main surface (102) includes a tilt angle in a range between 0.5° and 8° with a normal vector ($\vec{N}$) of a (0001) basal lattice plane (106) of the substrate, and
a bottom surface (104), a first chamfered peripheral region (110) arranged on the main surface (102), and a second chamfered peripheral region arranged on the bottom surface (104), wherein a surface of the first chamfered peripheral region includes a constant bevel angle with said main surface, the constant bevel angle extending from the main surface to a distal end of the silicon carbide substrate, wherein the first chamfered peripheral region (110) is arranged around at least 95% of a circumference of the substrate, and wherein a surface of the second chamfered peripheral region includes a constant bevel angle with said bottom surface (104), the constant bevel angle extending from the bottom surface (104) to the distal end of the silicon carbide substrate, wherein the second chamfered peripheral region is arranged around at least 95% of a circumference of the substrate, wherein, at least on the main surface (102), said constant bevel angle is chosen so that, in more than 75% of the chamfered peripheral region, the constant bevel angle, which is included by a normal vector ($\vec{F}\_t$) of the chamfered peripheral region (110) and the normal vector ($\vec{O}$) of the main surface (102), is smaller than the tilt angle, which is included by the normal vector ($\vec{O}$) of the main surface (102) and the normal vector ($\vec{N}$) of the (0001) basal lattice plane of the substrate.

2. Silicon carbide substrate according to claim 1, wherein a difference between the normal vector ($\vec{O}$) of the main surface and the normal vector ($\vec{N}$) of the (0001) basal lattice plane of the substrate is measured at a location (124) adjacent to the chamfered peripheral region.

3. Silicon carbide substrate according to claim 1, wherein said substrate has a surface roughness of equal to or less than 10 nm on at least 80% of the chamfered peripheral region.

4. Silicon carbide substrate according claim 1, wherein the substrate has a polytype selected from a group comprising 4H and 6H.

5. Silicon carbide substrate according to claim 1, wherein the substrate has a diameter of at least 150±0.2 mm and/or a thickness of 350±25 μm.

6. A silicon carbide wafer substrate for epitaxially deposited layers which is essentially monocrystalline, wherein the silicon carbide wafer substrate has a thickness of at least 200 μm and not more than 1000 μm, the silicon carbide wafer substrate comprising:

a main surface (102), wherein an orientation of said main surface (102) is such that a normal vector ($\vec{O}$) of the main surface (102) includes a tilt angle in a range between 0.5° and 8° with a normal vector ($\vec{N}$) of a (0001) basal lattice plane (106) of the substrate, a bottom surface (104), a first chamfered peripheral region (110) arranged on the main surface (102); and a second chamfered peripheral region arranged on the bottom surface (104), the first chamfered peripheral region (110) comprising a surface having a single, constant bevel angle extending from the main surface to a distal end of the silicon carbide substrate, wherein the chamfered peripheral region (110) is arranged around at least 95% of a circumference of the substrate, the second chamfered peripheral region comprising a surface having a constant bevel angle with said bottom surface (104), the constant bevel angle extending from the bottom surface (104) to the distal end of the silicon carbide substrate, wherein the second chamfered peripheral region is arranged around at least 95% of a circumference of the substrate, wherein, at least on the main surface (102), said constant bevel angle is chosen so that, in more than 75% of the chamfered peripheral region, the constant bevel angle, which is included by a normal vector ($\vec{F}\_t$) of the chamfered peripheral region (110) and the normal vector ($\vec{O}$) of the main surface (102), is smaller than the tilt angle, which is included by the normal vector ($\vec{O}$) of the main surface (102) and the normal vector ($\vec{N}$) of the (0001) basal lattice plane of the substrate.

* * * * *